US009054497B2

(12) United States Patent
Gmachl et al.

(10) Patent No.: US 9,054,497 B2
(45) Date of Patent: Jun. 9, 2015

(54) QUANTUM CASCADE LASERS WITH IMPROVED PERFORMANCE USING INTERFACE ROUGHNESS SCATTERING

(71) Applicant: The Trustees of Princeton University, Princeton, NJ (US)

(72) Inventors: Claire Gmachl, Princeton, NJ (US); YenTing Chiu, Princeton, NJ (US); Yamac Dikmelik, Baltimore, MD (US); Jacob B. Khurgin, Baltimore, MD (US)

(73) Assignees: The Trustees of Princeton University, Princeton, NJ (US); The Johns Hopkins University, Baltimore, MD (US)

( * ) Notice: Subject to any disclaimer, the term of this patent is extended or adjusted under 35 U.S.C. 154(b) by 307 days.

(21) Appl. No.: 13/624,330

(22) Filed: Sep. 21, 2012

(65) Prior Publication Data

US 2015/0131689 A1    May 14, 2015

Related U.S. Application Data

(60) Provisional application No. 61/537,409, filed on Sep. 21, 2011.

(51) Int. Cl.
*H01S 5/00* (2006.01)
*H01S 5/223* (2006.01)
*H01S 5/20* (2006.01)
*H01S 5/34* (2006.01)
*H01S 5/323* (2006.01)

(52) U.S. Cl.
CPC ............. *H01S 5/2231* (2013.01); *H01S 5/2004* (2013.01); *H01S 5/3402* (2013.01); *H01S 5/3401* (2013.01); *H01S 5/32316* (2013.01)

(58) Field of Classification Search
CPC ............................ H01S 5/3401; H01S 5/3402
USPC .......................................... 372/45.01, 45.012
See application file for complete search history.

(56) References Cited

U.S. PATENT DOCUMENTS 6,829,269 B2 * 12/2004 Goodhue et al. ............ 372/43.01
2010/0111127 A1 * 5/2010 Edamura et al. .......... 372/45.012

OTHER PUBLICATIONS

J. Faist, F. Capasso, D. Sivco, C. Sirtori, A. Hutchinson, and A. Cho, "Quantum Cascade Laser", Science, 264, 553 (1994).
R. Ferreira and G. Bastard, "Evaluation of some scattering times for electrons in unbiased and biased single- and multiple-quantum-well structures", Phys. Rev. B, 40, 1074 (1989).

(Continued)

*Primary Examiner* — Tod T Van Roy
*Assistant Examiner* — Vu A Vu
(74) *Attorney, Agent, or Firm* — Meagher Emanuel Laks Goldberg & Liao, LLP (57) ABSTRACT

A quantum cascade laser and method of making are disclosed. The quantum cascade laser includes a plurality stages configured in a cascade structure, each stage having a quantum well emission layer and an injection layer, each stage having an upper laser level and a lower laser level. A scattering barrier is located in the quantum well emission layer, the scattering barrier being positioned such that interface roughness (IFR) scattering at the lower laser level is greater than IFR scattering at the upper laser level. The scattering barrier may be located to maximize IFR scattering for the lower laser level and/or minimize IFR scattering for the upper laser level.

18 Claims, 10 Drawing Sheets

(56) References Cited

OTHER PUBLICATIONS

T. Unuma, M. Yoshita, T. Noda, H. Sakaki, and H. Akiyama, J., "Intersubband absorption linewidth in GaAs quantum wells due to scattering by interface roughness, phonons. alloy disorder, and impurities", Appl. Phys., 93, 1586 (2003).

M. P. Semtsiv, Y. Flores, M. Chashnikova, G. Monastyrskyi, and W. T. Masselink, "Low-threshold intersubband laser based on interface-scattering-rate engineering", Appl. Phys. Lett., 100, 163502 (2012).

T. Unuma, T. Takahashi, T. Noda, M. Yoshita, H. Sakaki, M. Baba, and H. Akiyama, "Effects of interface roughness and phonon scattering on intersubband absorption linewidth in a GaAs quantum well", Appl. Phys. Lett., 78, 3448 (2001).

K. L. Campman, H. Schmidt, A. Imamoglu, and A. C. Gossard, "Interface roughness and alloydisorder scattering contributions to intersubband transition linewidths", Appl. Phys. Lett., 69, 2554 (1996).

J. B. Khurgin, Y. Dikmelik, P. Q. Liu, A. J. Hoffman, M. D. Escarra, K. J. Franz, and C. F. Gmachl, "Role of interface roughness in the transport and lasing characteristics of quantum-cascade lasers", Appl. Phys. Lett., 94, 091101 (2009).

A. Bismuto, R. Terazzi, M. Beck, and J. Faist, "Influence of the growth temperature on the performances of strain-balanced quantum cascade lasers", Appl. Phys. Lett., 98, 091105 (2011).

C. Sirtori, F. Capasso, J. Faist, A. Hutchinson, D. Sivco, and A. Cho, "Resonant Tunneling in Quantum Cascade Lasers", IEEE J. Quantum Electron., 34, 1722 (1998).

J. B. Khurgin, "Inhomogeneous origin of the interface roughness broadening of intersubband transitions", Appl. Phys. Lett., 93, 091104 (2008).

P. Offermans, P. L. Koenraad, J. H. Wolter, M. Beck, T. Aellen, J. Faist, "Digital alloy interface grading of an InAlAs/InGaAs quantum cascade laser structure studied by cross-sectional scanning tunneling microscopy", Appl. Phys. Lett., 83, pp. 4131-4133 (2003).

P. Q. Liu, A. J. Hoffman, M. D. Escarra, K. J. Franz, J. B. Khurgin, Y. Dikmelik, X. Wang, J.Y. Fan, and C. F. Gmachl, "Highly power-efficient quantum cascade lasers", Nature Photonics, 4, 95-98 (2010).

A. Evans, S. R. Darvish, S. Slivken, J. Nguyen, Y. Bai, M. Razeghi, "Buried heterostructure quantum cascade lasers with high continuous-wave wall plug efficiency", Appl. Phys. Lett., 91, 071101 (2007).

Y. Bai, S. Slivken, S. Kuboya, S. R. Darvish, and M. Razeghi, "Quantum cascade lasers that emit more light than heat", Nature Photonics, 4, 99-102 (2010).

Y. Yao, X. Wang, J.Y. Fan, and C. F. Gmachl, "High performance "continuum-to-continuum" quantum cascade lasers with a broad gain bandwidth of over 400 cm-1", Appl. Phys. Lett., 97, 081115 (2010).

Y. Yao, W. O. Charles, T. Tsai, J. Chen, G. Wysocki, and C. F. Gmachl, "Broadband quantum cascade laser gain medium based on a "continuum-to-bound" active region design", Appl. Phys. Lett., 96, 211106 (2010).

Z. Liu, D. Wasserman, S. S. Howard, A. J. Hoffman, C. F. Gmachl, X. Wang, T. Tanbun-Ek, L. Cheng, and F.S. Choa, "Room-Temperature Continuous-Wave Quantum Cascade Lasers Grown by MOCVD Without Lateral Regrowth", IEEE PTL., 18, 12, 1347-1349 (2006).

X. Huang, W. O. Charles, and C. F. Gmachl, "Temperature-insensitive long-wavelength Quantum Cascade lasers with low threshold", Opt. Express, 19, 8297-8302 (2011).

K. Fujita, M. Yamanishi, T. Edamura, A. Sugiyama, and S. Furuta, "Extremely high T0-values ( 450K) of long-wavelength ( 15μm), low-threshold-current-density quantum-cascade lasers based on the indirect pump scheme", Appl. Phys. Lett., 97, 201109 (2010).

J. Faist, "Wallplug efficiency of quantum cascade lasers: Critical parameters and fundamental limits", Appl. Phys. Lett., 90, 253512 (2007).

J. B. Khurgin, Y. Dikmelik, "Transport and gain in a quantum cascade laser: model and equivalent circuit", Opt. Eng., 49(11),111110 (2010).

* cited by examiner

QUANTUM CASCADE LASERS WITH IMPROVED PERFORMANCE USING INTERFACE ROUGHNESS SCATTERING

CROSS-REFERENCE TO PRIOR FILED APPLICATIONS

This application claims priority to earlier filed provisional applications 61/537,409 filed on Sep. 21, 2011 which is incorporated herein in its entirety.

UNITED STATES GOVERNMENT RIGHTS

This invention was made with government support under MIRTHE (NSF-ERC, # EEC-0540832) and DARPA-EMIL. The government has certain rights to this invention.

FIELD OF INVENTION

The present invention relates to quantum cascade lasers. More particularly, it relates to quantum cascade lasers designs incorporating interface roughness induced intersubband scattering.

BACKGROUND

Quantum Cascade (QC) lasers are one of the key optical sources in the mid- and far-IR spectral range. In particular, QC lasers are well suited for applications in health and environment such as breath analysis, trace gas sensing, etc. For this reason, there is strong interest in the optimization of QC laser performance at room temperature with high power efficiency. There are many factors that influence the performance of QC lasers. For example, the electron transit time of many different Quantum Cascade lasers has been measured and compared to the calculated upper laser level lifetimes with and without taking into account interface roughness induced intersubband scattering. Improved designs are possible taking into account interface roughness induced intersubband scattering.

SUMMARY OF THE INVENTION

A quantum cascade laser and method of making are disclosed. The quantum cascade laser includes a plurality stages configured in a cascade structure, each stage having a quantum well emission layer and an injection layer, each stage having an upper laser level and a lower laser level. A scattering barrier is located in the quantum well emission layer, the scattering barrier being positioned such that interface roughness (IFR) scattering at the lower laser level is greater than IFR scattering at the upper laser level.

The scattering barrier may be located to maximize IFR scattering for the lower laser level. The scattering barrier may be located to minimize IFR scattering for the upper laser level. The scattering barrier may be located to maximize IFR scattering for the lower laser level and minimize scattering for the upper laser level. The quantum well emission layer may be dimensioned with a spacing between the energy levels larger than LO-phonon spacing.

The scattering barrier may have a thickness configured to set laser parameters. Each stage may be configured with a plurality of quantum wells. The quantum well emission layer may have two quantum wells, each quantum well having a scattering barrier positioned such that IFR scattering at the lower laser level is greater than IFR scattering at the upper laser level. The scattering barrier may have an interface roughness configured to increase laser performance. The interface roughness may be modified using growth interrupts.

A method of making a quantum cascade laser is also disclosed. The method includes forming a plurality stages configured in a cascade structure, each stage having a quantum well emission layer and an injection layer, each stage having an upper laser level and a lower laser level. The method also includes forming a scattering barrier located in the quantum well emission layer, the scattering barrier being positioned such that interface roughness (IFR) scattering at the lower laser level is greater than IFR scattering at the upper laser level.

The scattering barrier may be located to maximize IFR scattering for the lower laser level. The scattering barrier may be located to minimize IFR scattering for the upper laser level. The scattering barrier may be located to maximize IFR scattering for the lower laser level and minimize scattering for the upper laser level. The quantum well emission layer may be dimensioned with a spacing between the energy levels larger than LO-phonon spacing.

The scattering barrier may be formed with a thickness configured to set laser parameters. Each stage may be formed with a plurality of quantum wells. The quantum well emission layer may be formed with two quantum wells, each quantum well having a scattering barrier positioned such that IFR scattering at the lower laser level is greater than IFR scattering at the upper laser level. The scattering barrier may be formed with an interface roughness configured to increase laser performance. The interface roughness may be modified using growth interrupts.

BRIEF DESCRIPTION OF THE FIGURES

FIG. 1$a$ is a conduction band diagram of a Quantum Cascade laser;

FIG. 1$b$ is an example of a 'baseline' design of a QCL quantum well emission layer;

FIG. 1$c$ is an example of a "lower efficiency" QCL active region with a scattering barrier disposed in the $2^{nd}$ quantum well;

FIG. 1$d$ is an example of a "higher efficiency" QCL active region with a scattering barrier disposed in the $3^{rd}$ quantum well;

FIG. 3$a$ is a graph showing upper laser level lifetimes calculated for different QC laser designs in various wavelength regions;

FIG. 3$b$ is a graph showing lower laser level lifetimes calculated for different QC laser designs in various wavelength regions;

DETAILED DESCRIPTION OF THE INVENTION

Quantum Cascade (QC) lasers have become one of the key optical sources in the midinfrared (mid-IR) spectral range. In particular, QC lasers are well suited for applications in health and environmental sensing such as greenhouse gas monitoring and air pollutant detection, etc. For this reason, there is strong interest in the optimization of QC laser performance at room temperature with high power efficiency. Much effort has been undertaken in optimizing the QC laser performance over the years. Since QC lasers are semiconductor lasers based on intersubband transitions in quantum wells, one of the most important parameters in QC laser performance is the relationship between the lifetimes of the upper and lower laser subbands, which determines the magnitude of population inversion. Therefore, it is important to accurately account for intersubband scattering when designing QC lasers.

The intersubband transition lifetimes can be determined by various scattering processes such as longitudinal optical (LO) phonons, longitudinal acoustic optical (LA) phonons, alloy disorder, or ionized impurities. Traditionally, since LO-phonons have the fastest scattering rate among those, intersubband scattering in QC lasers is understood to be dominated by LO-phonon scattering. What has long been neglected is that interface roughness also causes intersubband scattering. Interface roughness induced scattering may have effects on the intersubband absorption, the temperature dependent intersubband broadening and the transport process limited by resonant tunneling, all of which strongly affect the QC laser performance. Calculated interface roughness (IFR) scattering lifetimes between the upper and lower laser states, depending on the interface conditions, can be comparable to or even faster than those caused by LO-phonon scattering. However, a thorough experimental study of the effect of interface roughness on intersubband scattering lifetimes is still lacking.

Figure 1A:
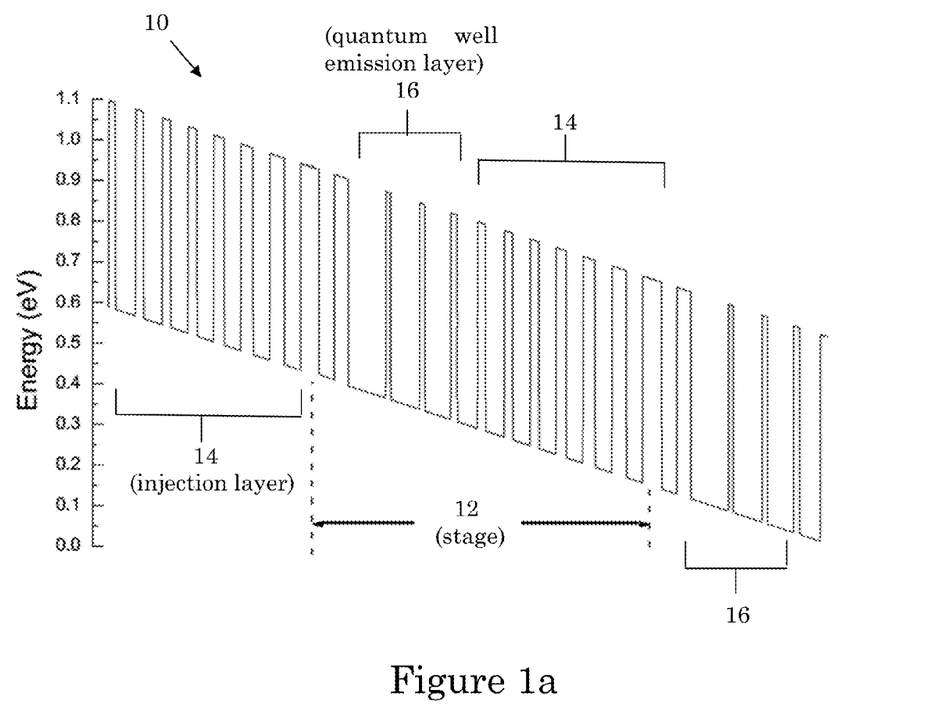

FIG. 1a is a schematic conduction band diagram of a Quantum Cascade laser (QCL) 10. The QCL 10 generally includes a plurality stages 12 configured in a cascade structure, each stage 12 having an injection layer 14 and a quantum well emission layer 16. Each stage also has one or more upper laser levels and lower laser level(s). Light is generated by an intersubband transition of electrons from an upper laser level to a lower laser level in the quantum well emission layer as discussed in more detail below.

Figure 1B:
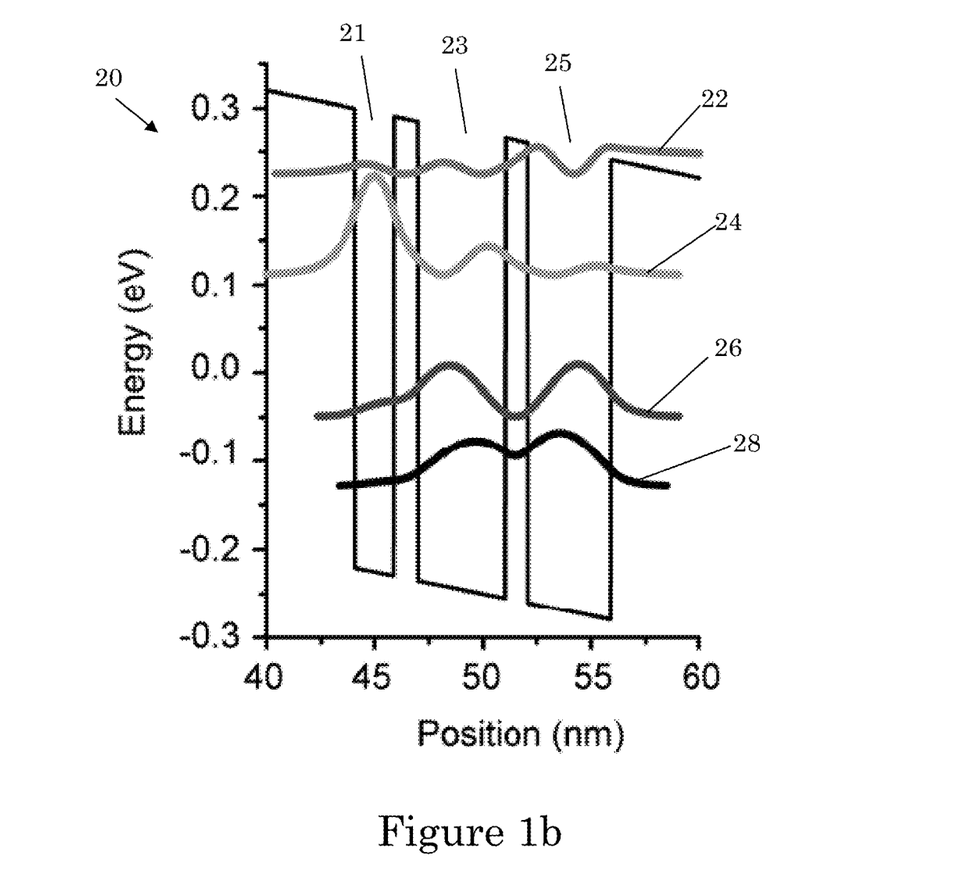

FIG. 1b is an example of a 'baseline' design (band structure) of a QCL quantum well emission layer (active region) 20. In this example, the active region includes several quantum wells 21, 23, 25. Several energy levels 22, 24, 26 and 28 are also illustrated. Of these energy levels, laser levels 24 and 26 actually participate in lasing transition as upper/lower laser levels. That is, light is generated via intersubband transition of electrons from upper laser level 24 to lower laser level 26 in the quantum well emission layer.

Figure 1C:
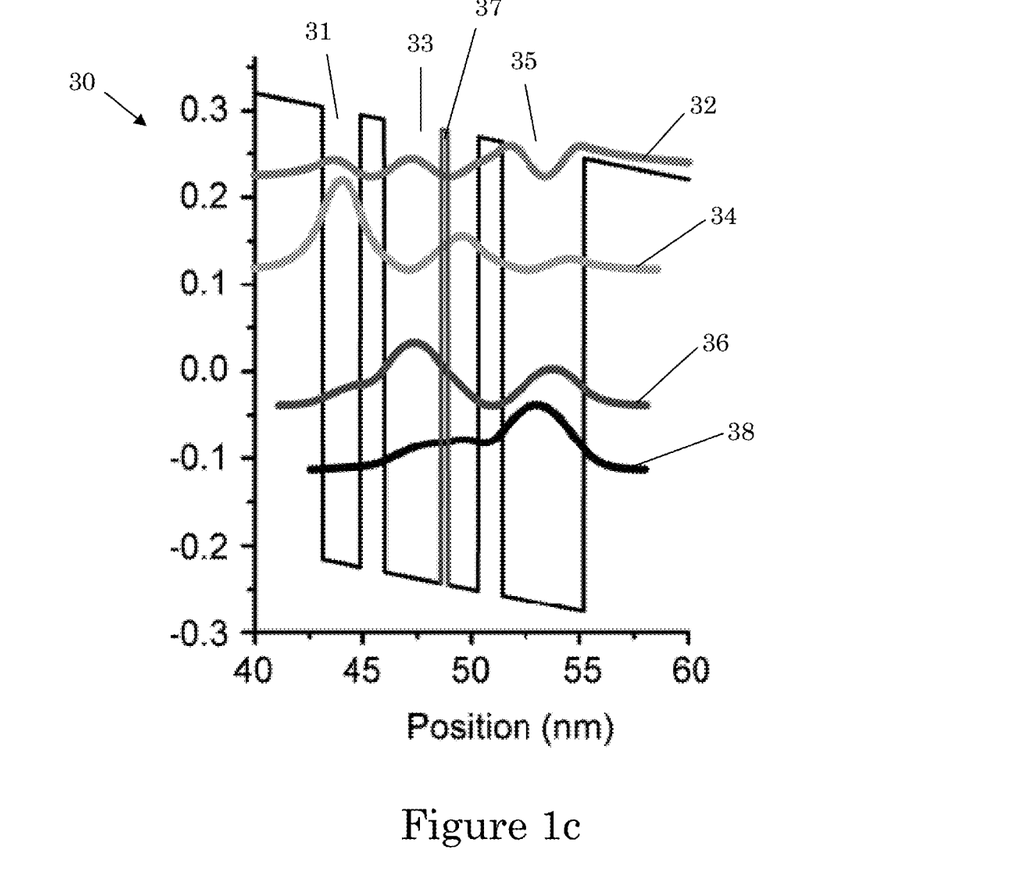

FIG. 1c is an example of a "lower efficiency" QCL active region 30 with a scattering barrier 37 disposed in the $2^{nd}$ quantum well 33. In this example, the active region includes three quantum wells 31, 33, 35. Several energy levels 32, 34, 36 and 38 are also illustrated. Of these energy levels, laser levels 34 and 36 actually participate in lasing transition as upper/lower laser levels.

For improved performance, a scattering barrier should be located in a quantum well such that scattering for the lower laser level 36 is greater than scattering for the upper laser level 34. In order to maximize the performance increase, the scattering barrier may be placed to maximize scattering for the lower laser level 36 and/or minimize scattering for the upper laser level 34. In general scattering increases at peaks in the laser level.

In this example, the scattering barrier 37 (monolayer) is located such that scattering for the lower laser level 36 is lower than scattering for the upper laser level 34. That is, the scattering barrier 37 is placed in the 2nd quantum well where a peak in the wave function of the upper laser level 34 overlaps with the lower laser level 36. As a result, theoretical calculations show about 50% reduction of upper state lifetime, which would in turn degrade the device performance over the baseline design shown in FIG. 1b.

Figure 1D:
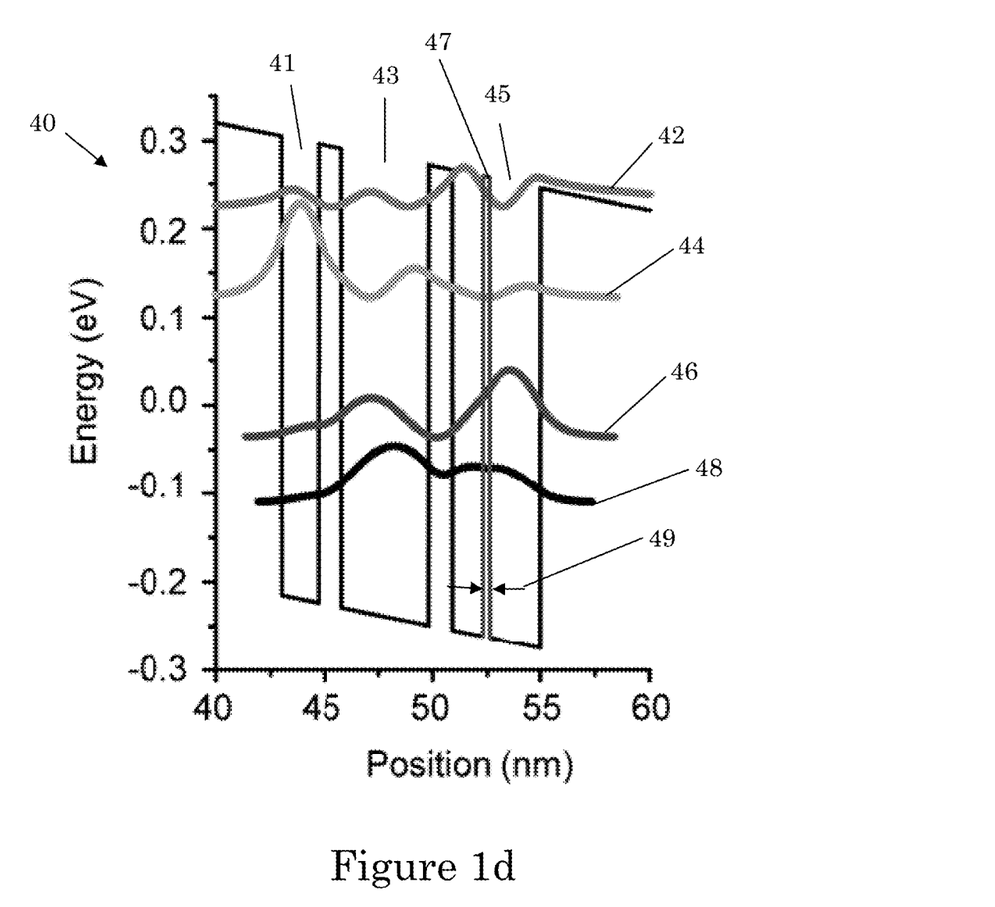

FIG. 1d is an example of a 'higher efficiency' QCL design 42 with a scattering barrier 47 in the 3rd quantum well 45 to speed up the carrier extraction from the lower laser state. In this example, the active region includes three quantum wells 41, 43, 45. Several energy levels 42, 44, 46 and 48 are also illustrated. Of these energy levels, laser levels 44 and 46 actually participate in lasing transition as upper/lower laser levels.

In this example, the scattering barrier 47 is located such that scattering the lower laser level 46 is greater than scattering for the upper laser level 44. That is, the scattering barrier 47 is positioned such that the peak in the lower energy level 46 (as measured from the zero level for the lower energy level) is significantly higher than the peak in the upper laser level 44 (as measured from the zero level for the upper laser level). This would result in roughly an increase of 35% in gain, and ~50% higher slope efficiency compared to the base design in FIG. 1b. As explained above, In order to maximize the performance increase the scattering barrier may be placed to maximize scattering for the lower laser level 46 and/or minimize scattering for the upper laser level 44.

Traditional QCL structures (FIG. 1a) are typically designed using LO design criteria and are therefore dimensioned using LO-phonon spacing (~35-40 meV). In the above design (FIG. 1d) the energy difference between the lower laser state and the state below may be much larger than one LO-phonon energy in order to minimize thermal back filling. Such QCL designs are well suited for high temperature laser applications. It is also noted that in this example, the scattering barriers 37 and 47 are generally configured with a minimal thickness 49, e.g., ~0.30 nm, to preserve the geometry of an existing QCL design. The scattering barriers may be treated as one of the layers in QC laser structure, grown during the same growth process as the rest of the QC laser structure. The growing techniques may include typical deposition technique such as molecular beam epitaxy (MBE) and eetalorganic chemical vapor deposition (MOCVD). It should be understood that the thickness of the scattering barrier may be selected to alter the geometry and performance of a QCL design (to set laser parameters).

It should be understood that the quantum well emission layer may be configured with a plurality of quantum wells. Two or more quantum wells may be configured each with a scattering barrier positioned such that interface roughness (IFR) scattering at the lower laser level is greater than IFR scattering at the upper laser level.

In order to verify the effect of IFR scattering, disclosed herein are the calculated the upper and lower laser level lifetimes of 22 existing QC laser designs with and without the consideration of IFR scattering. Assuming the same interface roughness conditions for all designs, the calculated lifetimes' dependence on IFR scattering may vary depending on different lasing wavelength and material compositions as well as design, i.e. wave function overlap with interfaces. We then measure the non-lasing current and voltage (IV) characteristic curves for 14 of these QC devices which are directly available. Since the maximum current density is limited by the upper laser level lifetime, a comparison with the calculations can be made. A significantly better agreement between the experimental results and the calculations is determined when IFR scattering is taken into account which confirms that IFR scattering plays an important role in intersubband scattering in QC lasers.

Interface roughness can be modeled as a random profile with Gaussian autocorrelation which is characterized by an average root-mean-square step height $\Delta$ and an in-plane correlation length $\lambda$. The intersubband scattering lifetime ($\tau_{IFR}$) caused by interface roughness can then be calculated:

$$\hbar \tau_{IFR} = \frac{\pi m^*}{\hbar^2} \Delta^2 \lambda^2 \delta U^2 \sum_i \{f_2(z_i) f_1(z_i)\}^2 e^{-\frac{\lambda^2 q_{21}^2}{4}} \quad (1)$$

Here, $\delta U$ is the band offset, $f_2(z_i)$ and $f_1(z_i)$ are the wave function amplitudes at the ith interface, and $q_{21}$ is the absolute value of the two-dimensional scattering vector in this process. It should be understood that increasing the interface roughness may result in increased performance since the $\Delta$ term is squared in EQ. 1. Accordingly, the interface roughness may be modified or controlled during or after formation, e.g., using growth interrupts or other techniques.

Figure 2:
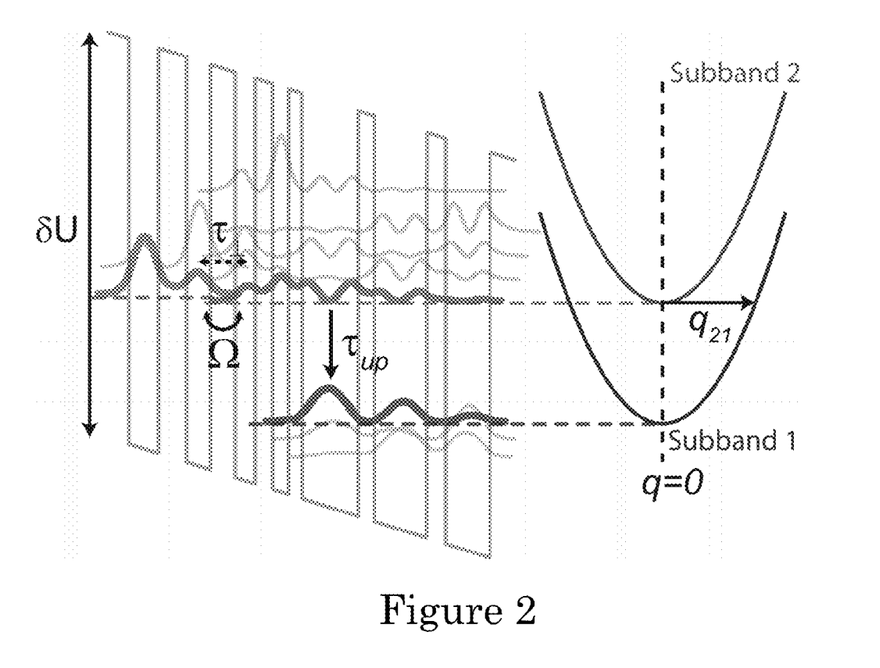
FIG. 2 is a conduction band diagram of a QC laser with the parabolas representing the energy dispersion for upper (subband 2) and lower (subband 1) laser levels.

FIG. 2 shows the band structure of a QC laser with the parabolas representing the energy dispersion for upper (subband 2) and lower (subband 1) laser levels. The arrow $q_{21}$ illustrates the interface roughness induced transition from subband 2 to subband 1. A constant $\Delta \sim 0.15$ nm which is about half of the monolayer thickness and a $\lambda \sim 6$ nm are used for all the designs analyzed in the following interface roughness scattering calculations.

Figure 3:
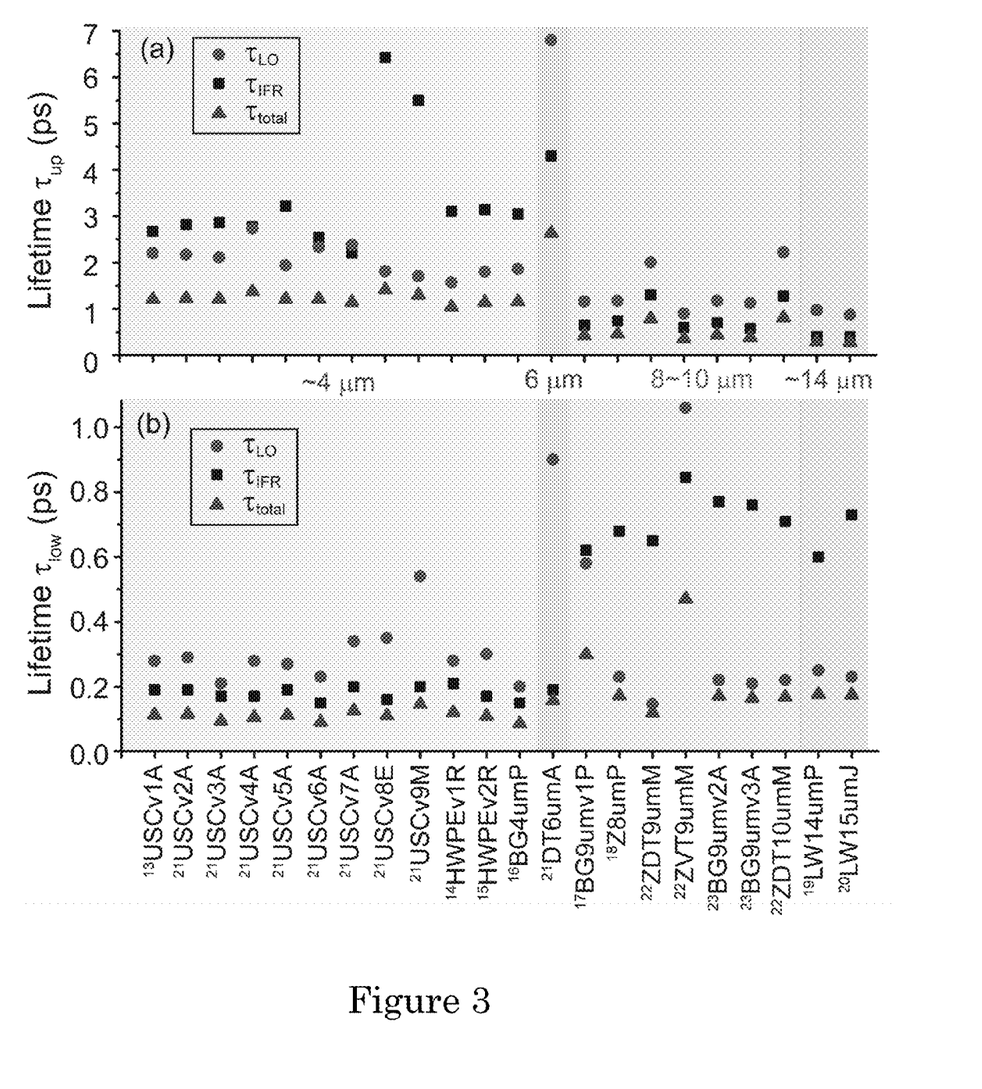

FIG. 3a is a graph showing upper laser level lifetimes calculated for different QC laser designs in various wavelength regions. FIG. 3b is a graph showing lower laser level lifetimes calculated for different QC laser designs in various wavelength regions. Squares are lifetimes calculated by IFR scattering only. Circles are lifetimes calculated by LO phonon scattering only. Triangles are lifetimes taking into account of both IFR and LO phonon scattering.

As shown in FIGS. 3a and 3b, the lifetimes calculated from IFR scattering ($\tau_{IFR}$) are comparable to the lifetimes calculated from LO-phonon scattering ($\tau_{LO}$), this means that the effect of IFR scattering on intersubband scattering can no longer be neglected, and both LO-phonon and IFR scattering processes should be taken into account in calculating the overall intersubband lifetimes. Combining both scattering processes, $\tau_{total}$ can be calculated by $1/\tau_{total}=1/\tau_{LO}+1/\tau_{IFR}$ (shown as triangles in FIGS. 3a and 3b).

For the upper laser level lifetimes, since the square of $q_{21}$ in Eq. (1) is proportional to the transition energy between two states, the calculated $\tau_{IFR}$ thus has an exponential dependence on the transition energy: the longer the wavelength, the shorter the $\tau_{IFR}$ is. While LO-phonon scattering rate is just quadratically dependent on the scattering vector, IFR scattering has become the dominating intersubband scattering mechanism for the longer wavelength (>8 μm) QC lasers as shown in FIG. 3a.

Figure 4:
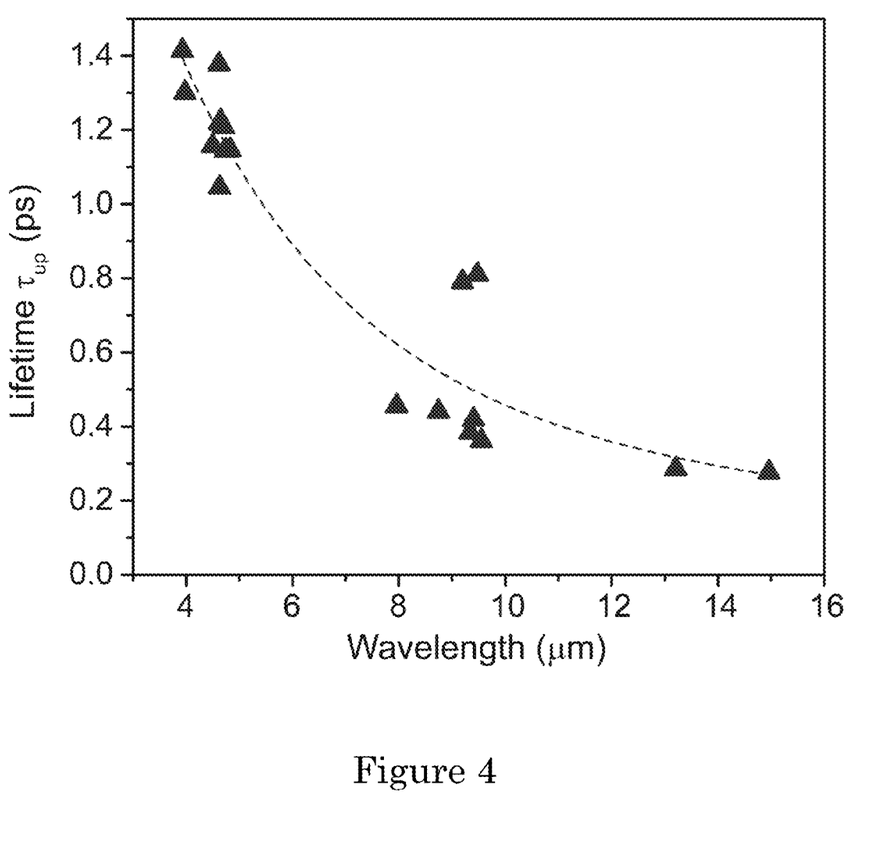
FIG. 4 is a graph showing the calculated upper laser level lifetimes when both LO-phonon and IFR scattering are taken into account as a function of wavelength.

FIG. 4 is a graph showing the calculated upper laser level lifetimes when both LO-phonon and IFR scattering are taken into account as a function of wavelength. The dashed line is a guide for the eye only. Even though LO-phonon scattering still dominates at the shorter wavelength range (~4 μm), the calculated $\tau_{total}$ is reduced by almost 50% when including IFR scattering. Plotting the calculated $\tau_{total}$ as a function of lasing wavelength, the dependence of upper laser level lifetimes on the wavelength is clearly seen.

On the other hand, the conventional depopulation energy for the lower laser level is designed to be around 34 meV for the QC laser designs we analyze here, so the difference between $\tau_{IFR}$ of the lower laser level has very little dependence on the depopulation energy. However, the material compositions for different wavelength range designs are different, thus affecting the band offset $\delta_U$ in Eq. (1). For QC lasers with design wavelength >8 μm, lattice-matched $In_{0.53}Ga_{0.47}As/Al_{0.48}In_{0.52}As$ on InP is used; for QC lasers with <8 μm design wavelength, strain-balanced material is used to create a larger band offset. The larger band offset for short wavelength QC laser designs results in the domination of the lower laser level lifetime by IFR scattering as can be seen in FIG. 3b.

Quantum Cascade lasers are usually designed to have a sufficiently quick electron injection from the preceding injector to the upper laser level through resonant tunneling (see FIG. 2), and electrons depopulate similarly fast from the lower laser level to the following injector. In the tight-binding approximation, the current density can be written as:

$$J = qN_s \frac{2|\Omega|^2 \tau_\perp}{1 + \Delta^2 \tau_\perp^2 + 4|\Omega|^2 \tau_{up} \tau_\perp} \quad (2)$$

where q is the electric charge, $N_s$ is the sheet doping density, $|\Omega|$ is the coupling strength between the injector ground state and the upper laser level, $\hbar \Delta$ (where $\hbar$ is the reduced Planck's constant) is the energy detuning from resonance, $\tau_\perp$ is the in-plane momentum relaxation time, and $\tau_{up}$ is the upper laser level lifetime. When the system is at full resonance ($2\hbar\Delta=0$) and the coupling energy between the injector ground state and the upper laser level is strong enough ($4|\Omega|^2 \tau_{up}\tau_\perp \gg 1$), which is the case for most of the designs analyzed here, the maximum current density ($J_{max}$) can be conveniently written as $J_{max}=qN_s/\tau_{transit}$ and $\tau_{transit}=2\tau_{up}$. Here $\tau_{transit}$ is defined as the global transit time of the electron across a period of the active region at resonance.

The current-voltage characteristics of 14 non-lasing circular mesa samples from the QC laser designs in FIG. 2 are measured. As the applied voltage keeps increasing, the QC device eventually encounters the cut-off voltage ($V_{cutoff}$) at which the ground state in the injector is no longer aligned with the upper laser level, forming a kink in the IV and the differential resistance deviates from the original value.

Figure 5:
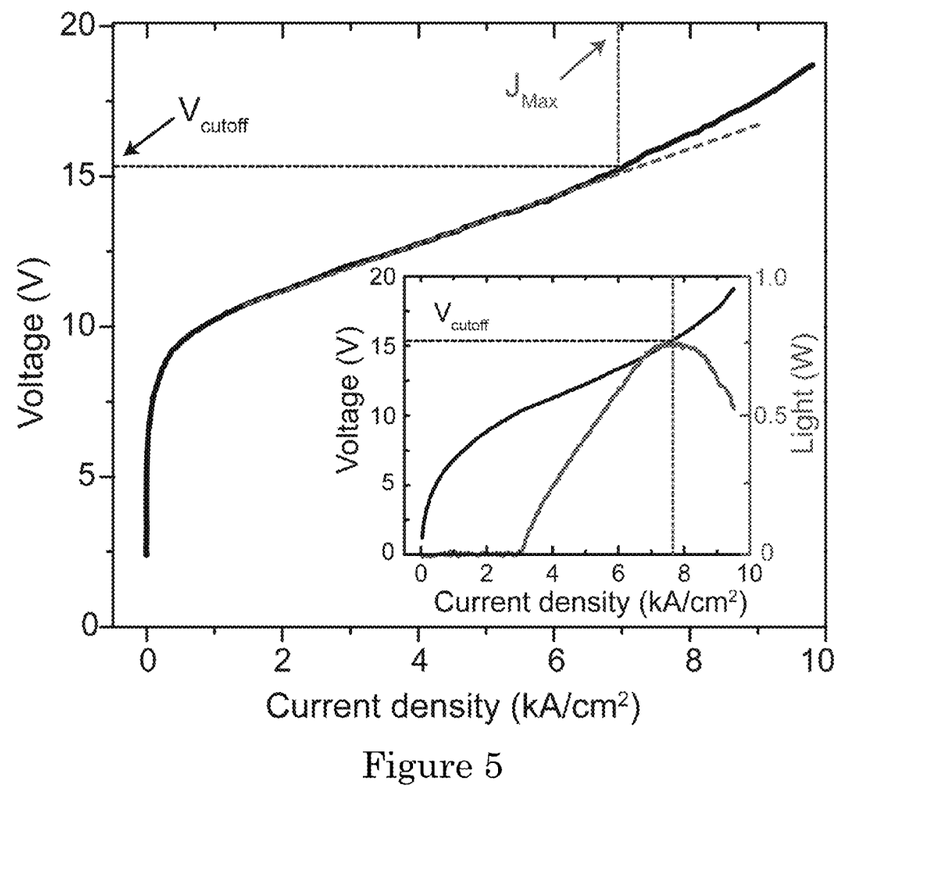
FIG. 5 is a graph showing the current-voltage characteristic of a non-lasing circular mesa sample at T=80 K.

FIG. 5 is a graph showing the current-voltage characteristic of a non-lasing circular mesa sample at T=80 K. The $J_{max}$ of a QC device is determined as shown in FIG. 5. The inset in FIG. 5 shows the light-current-voltage characteristics of the laser fabricated from the same QC wafer. The cut-off voltage is the same for both the lasing and non-lasing QC devices though $J_{max}$ increases for a laser device due to the reduction of differential resistance when there is stimulated emission. With $J_{max}$ for all 14 QC designs determined and using Ns of each design, $\tau_{transit}$ can be extracted. The measured $\tau_{transit}$ are plotted in FIG. 5 as a function of lasing wavelength. A similar dependence on the lasing wavelength for the measured $\tau_{transit}$ is also seen as in the case for the calculated $\tau_{up}$ (FIG. 4).

A direct comparison between the measurements and the calculations can be made from the relationship between $\tau_{up}$ and $\tau_{transit}$ derived above. However, the actual doping density may be slightly different from the designed values due to different growth conditions. Also, the model used to derive Eq. (2) underestimates electron transport through many injector states, it is more suitable to set upper laser level lifetime as the lower limit for half of the transit lifetime. Therefore, instead of comparing the measured $\tau_{transit}/2$ values directly with the calculated $\tau_{up}$ values, we plot the calculated $\tau_{up}$ as a function of the measured $\tau_{transit}/2$ to illustrate the correlation between them.

Figure 7:
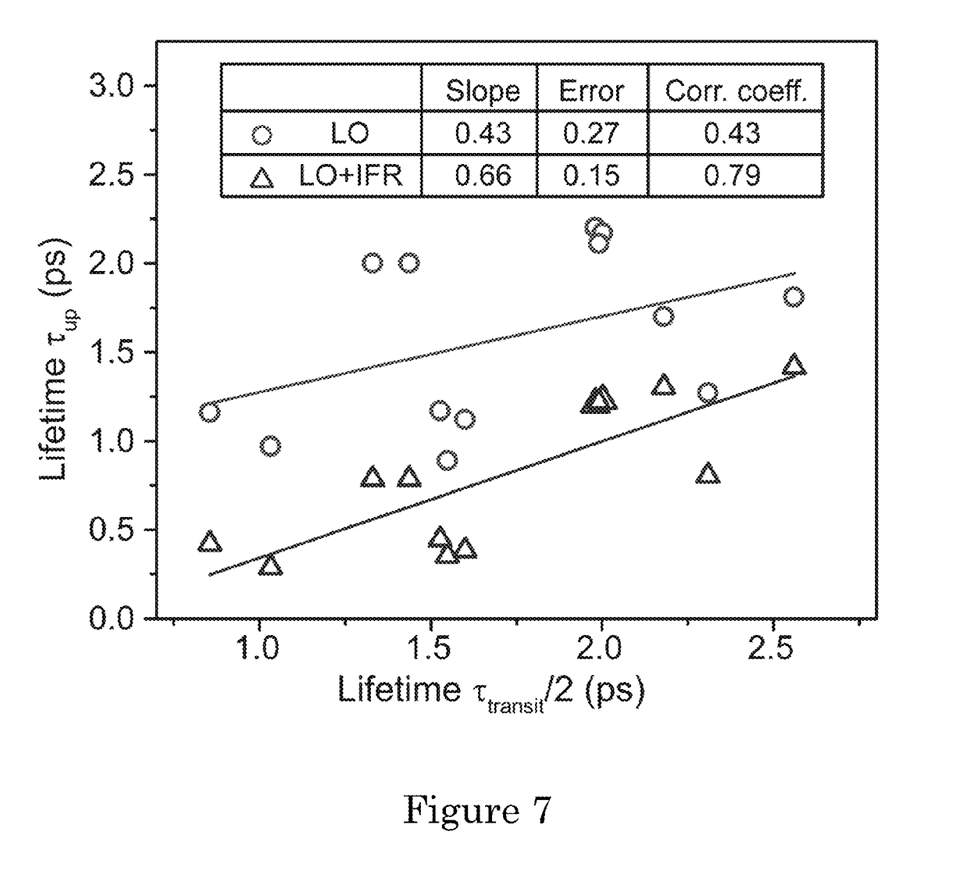
FIG. 7 is a graph showing the calculated upper laser level lifetimes plotted as a function of half the measured transit lifetimes with (triangles) and without (circles) taking into account of interface roughness scattering.

FIG. 7 is a graph showing the calculated upper laser level lifetimes plotted as a function of half the measured transit lifetimes with (triangles) and without (circles) taking into account of interface roughness scattering. The inset table lists the slopes, standard error and correlation coefficients of the fit curves.

Figure 6:
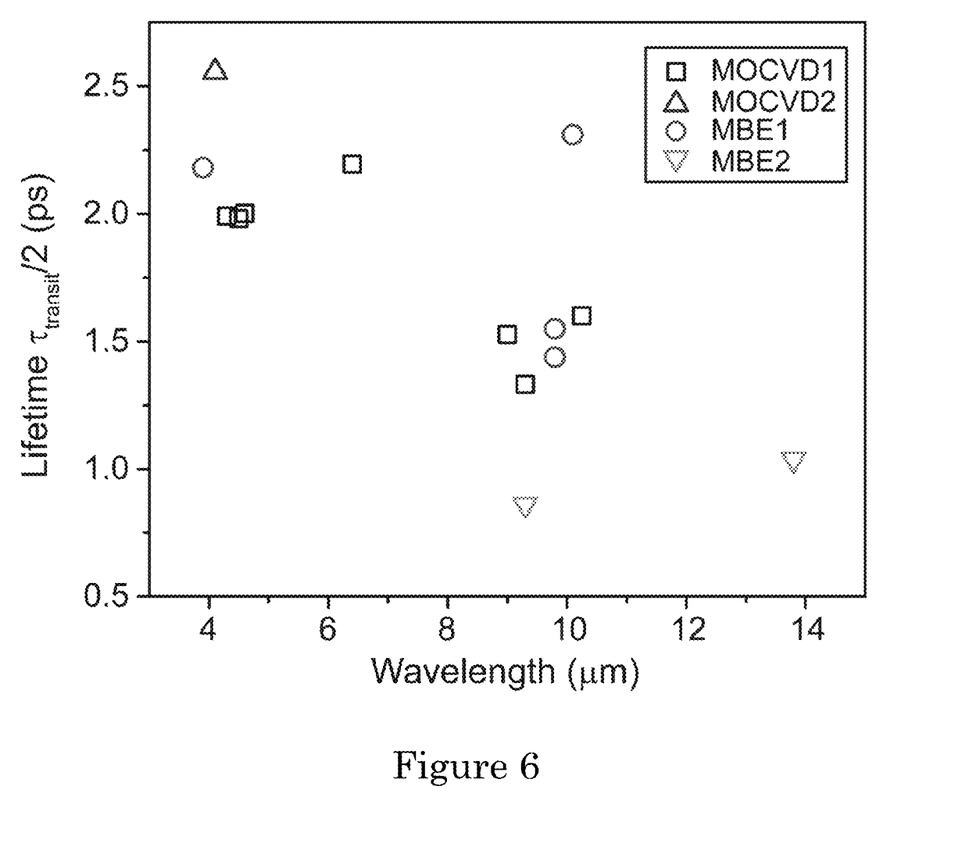
FIG. 6 is a graph showing measured transit lifetimes as a function of the lasing wavelength.

As shown in FIG. 7, the $\tau_{up}$ calculated using LO-phonon scattering only are plotted as circles, the line (linear fit) through all the data points has a slope of 0.43, standard error 0.27 and correlation coefficient of 0.43; the $\tau_{up}$ calculated with both LO-phonon and IFR scattering are plotted as triangles, the line (linear fit) through all the data points has a slope of 0.66, standard error 0.15 and correlation coefficient 0.79. The much smaller error and the larger correlation coefficient indicate a better agreement between the measured $\tau_{transit}$ and the calculated $\tau_{up}$ when IFR scattering is taken into account, which confirms that IFR scattering plays a non-negligible role for intersubband scattering in mid-IR QC lasers. FIG. 6 is a graph showing measured transit lifetimes as a function of the lasing wavelength. The different shapes indicate different growth facilities and growth techniques.

In conclusion, theoretical calculations of both upper and lower laser level lifetimes for many existing mid-IR QC laser designs have been demonstrated with and without the consideration of IFR scattering. The upper laser level lifetime is reduced by almost a factor of 2 when not only LO-phonon but also IFR scattering is taken into account; meanwhile, the calculated lower laser level lifetimes show a dependence on material compositions and the larger band offset results in the domination of lower laser level lifetime by IFR scattering. The importance of the calculated total upper laser level lifetime $\tau_{up}$ on lasing wavelength due to the energy of the transition in IFR induced intersubband scattering is also observed in the measured τtransit: the longer the wavelength, the smaller the $\tau_{up}$ or $\tau_{transit}$ are. Linear relationships with slopes of 0.43±0.27 and 0.66±0.15; correlation coefficients of 0.79 and 0.43, with and without the consideration of IFR scattering respectively, have been established between the measurement and the calculation. The significantly better correlation when both LO-phonon and IFR scattering are taken into account not only proves the importance of including IFR scattering into the evaluation of intersubband scattering lifetime in mid-IR QC laser designs but opens the exciting possibility of using interface roughness scattering to engineer lifetimes for improved laser performance.

It should be understood that a wide variety of devices are possible by engineering the intersubband lifetimes of quantum cascade lasers (QCLs) with interface roughness scattering for improved laser performance. The disclosed techniques position extra interfaces strategically into the conventional QCL design to facilitate carrier depopulation, and broaden the gain spectrum. The disclosed techniques also relax the traditional design criteria which can help improve device temperature performance. For example, the traditional QCL structures designed using LO-phonon design criteria are typically dimensioned using optical phonon spacing (~35-40 meV). Designs based on the techniques herein may use a spacing between subsequent energy levels in excess of LO-phonon spacing.

Resulting devices are well suited for applications such as trace gas sensing, breath analysis, glucose testing, etc., as well as IR countermeasures, and have advantages including being non-invasive, portable, and high power. Resulting devices may be made, e.g., from molecular beam epitaxy (MBE) or metalorganic chemical vapor deposition (MO CVD).

Although features and elements are described above in particular combinations, each feature or element may be used alone without the other features and elements or in various combinations with or without other features and elements.

What is claimed is:

1. A quantum cascade laser comprising:
    a plurality stages configured in a cascade structure, each stage having a quantum well emission layer and an injection layer, each stage having an upper laser level and a lower laser level; and
    a scattering barrier located in the quantum well emission layer, the scattering barrier being positioned such that interface roughness (IFR) scattering at the lower laser level is greater than IFR scattering at the upper laser level, the scattering barrier being located to maximize IFR scattering for the lower laser level.

2. The quantum cascade laser of claim 1, wherein the scattering barrier located to minimize IFR scattering for the upper laser level.

3. The quantum cascade laser of claim 1, wherein the scattering barrier is located to maximize IFR scattering for the lower laser level and minimize scattering for the upper laser level.

4. The quantum cascade laser of claim 1, wherein the quantum well emission layer is dimensioned with a spacing between the energy levels larger than LO-phonon spacing.

5. The quantum cascade laser of claim 1, wherein scattering barrier has a thickness configured to set laser parameters.

6. The quantum cascade laser of claim 1, wherein each stage is configured with a plurality of quantum wells.

7. The quantum cascade laser of claim 1, wherein the quantum well emission layer has two quantum wells, each quantum well having a scattering barrier positioned such that IFR scattering at the lower laser level is greater than IFR scattering at the upper laser level.

8. The quantum cascade laser of claim 1, wherein the scattering barrier has an interface roughness configured to increase laser performance.

9. The quantum cascade laser of claim 8, wherein the interface roughness is modified using growth interrupts.

10. A method of making a quantum cascade laser, the method comprising:
    forming a plurality stages configured in a cascade structure, each stage having a quantum well emission layer and an injection layer, each stage having an upper laser level and a lower laser level; and
    forming a scattering barrier located in the quantum well emission layer, the scattering barrier being positioned such that interface roughness (IFR) scattering at the lower laser level is greater than IFR scattering at the upper laser level, the scattering barrier being located to maximize IFR scattering for the lower laser level.

11. The method of claim 10, further comprising locating the scattering barrier to minimize IFR scattering for the upper laser level.

12. The method of claim 10, further comprising locating the scattering barrier to maximize IFR scattering for the lower laser level and minimize scattering for the upper laser level.

13. The method of claim 10, further comprising dimensioning the quantum well emission layer with a spacing between the energy levels larger than LO-phonon spacing.

14. The method of claim 10, wherein scattering barrier has a thickness configured to set laser parameters.

15. The method of claim 10, wherein each stage is configured with a plurality of quantum wells.

16. The method of claim 10, further comprising forming the quantum well emission layer with two quantum wells, each quantum well having a scattering barrier positioned such that IFR scattering at the lower laser level is greater than IFR scattering at the upper laser level.

17. The method of claim 10, further comprising forming the scattering barrier with an interface roughness configured to increase laser performance.

18. The method of claim 17, further comprising forming the scattering barrier using growth interrupts.

* * * * *

UNITED STATES PATENT AND TRADEMARK OFFICE
CERTIFICATE OF CORRECTION

PATENT NO. : 9,054,497 B2  Page 1 of 1
APPLICATION NO. : 13/624330
DATED : June 9, 2015
INVENTOR(S) : Claire Gmachl et al.

It is certified that error appears in the above-identified patent and that said Letters Patent is hereby corrected as shown below:

In the Specification

Column 1, lines 14-16, delete the text beginning with "This invention was made" to and ending with "has certain rights in the invention.", and insert the following:
--This invention was made with government support under Grant #EEC-0540832 awarded by the National Science Foundation and Grant #FA8650-07-1-7708 awarded by the United States Air Force Research Laboratory. The government has certain rights in this invention.--

Signed and Sealed this
Twenty-ninth Day of September, 2015

Michelle K. Lee
*Director of the United States Patent and Trademark Office*